United States Patent
Draper

[19]

[11] Patent Number: 6,096,588
[45] Date of Patent: Aug. 1, 2000

[54] METHOD OF MAKING TRANSISTOR WITH SELECTIVELY DOPED CHANNEL REGION FOR THRESHOLD VOLTAGE CONTROL

[75] Inventor: Donald A. Draper, San Jose, Calif.

[73] Assignee: Advanced Micro Devices, Inc., Sunnyvale, Calif.

[21] Appl. No.: 08/969,426

[22] Filed: Nov. 1, 1997

[51] Int. Cl.$^7$ .................................................. H01L 21/336
[52] U.S. Cl. ........................................... 438/197; 438/217
[58] Field of Search ..................................... 438/217, 197

[56] References Cited

U.S. PATENT DOCUMENTS

| | | | |
|---|---|---|---|
| H986 | 11/1991 | Codella et al. | 437/41 |
| 4,225,875 | 9/1980 | Ipri | 357/23 |
| 4,272,881 | 6/1981 | Angle | 29/571 |
| 4,329,186 | 5/1982 | Kotecha et al. | 148/1.5 |
| 4,927,777 | 5/1990 | Hsu et al. | 437/44 |
| 5,073,514 | 12/1991 | Ito et al. | 437/44 |
| 5,132,753 | 7/1992 | Chang et al. | 357/23.4 |
| 5,171,700 | 12/1992 | Zamanian | 437/44 |
| 5,200,358 | 4/1993 | Bollinger et al. | 437/180 |
| 5,286,664 | 2/1994 | Horiuchi | 437/44 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 61-194777 | 8/1986 | Japan . |
| 1-18762 | 1/1992 | Japan . |
| 08078672 | 3/1996 | Japan . |

OTHER PUBLICATIONS

IBM Technical Disclosure Bulletin XP 000671026, "Process for Making Very Small, Asymmetric, Field–Effect Transistors", vol. 30, No. 3, Aug. 1987, pp. 1136–1137.

IBM Technical Disclosure Bulletin XP 000120044, "Low Series Resistance Source by Spacer Methods", vol. 33, No. 1A, Jun. 1, 1990, pp. 75–77.

U.S. Patent Application Serial No.: 08/695,101, filed Aug. 7, 1996, entitled "Selectively Doped Channel Region for Increased Idsat and Method for Making Same", by Gardner et al. (Copy not enclosed).

U.S. Patent application Serial No.: 08/787,036, filed Jan. 28, 1997, entitled "Method of Making an IGFET with a Non–Uniform Lateral Doping Profile in the Channel Region," by Gardner et al. (Copy not enclosed).

Wolf, S.,"Silicon Processing for the VLSI ERA—vol. 3: The Submicron MOSFET," Lattice Press, Sunset Beach, CA, 1995, pp. 238–240, 309–311, and 621–622.

vol. 011, No. 023 (E–473) & 61 194777 A (Hitachi Ltd.) Aug. 29, 1986, Jan. 22, 1987 Patent Abstracts of Japan.

*Primary Examiner*—Tuan H. Nguyen
*Assistant Examiner*—Craig Thompson
*Attorney, Agent, or Firm*—Skjerven, Morrill, MacPherson, Franklin & Friel, LLP

[57] ABSTRACT

A method of making an IGFET with a selected threshold voltage is disclosed. The method includes providing a semiconductor substrate with a device region that includes a source region, a drain region and a channel region therebetween, forming a gate over the channel region, introducing a threshold adjust dopant into the channel region after forming the gate without transferring essentially any of the threshold adjust dopant through the gate, thereby adjusting a threshold voltage of the IGFET, and forming a source in the source region and a drain in the drain region. Preferably, the threshold adjust dopant is introduced by implanting the threshold adjust dopant into the source region and diffusing the threshold adjust dopant from the source region into the channel region before providing any source/drain doping. The invention is well-suited for adjusting the threshold voltage, and therefore the drive current, leakage current and speed, of selected IGFETs, so that the fastest IGFETs with the highest leakage currents can be placed in critical speed paths such the tag to an instruction cache.

20 Claims, 6 Drawing Sheets

U.S. PATENT DOCUMENTS

| | | | |
|---|---|---|---|
| 5,296,398 | 3/1994 | Noda | 437/44 |
| 5,349,225 | 9/1994 | Redwine et al. | 257/336 |
| 5,364,807 | 11/1994 | Hwang | 437/44 |
| 5,366,915 | 11/1994 | Kadama | 437/43 |
| 5,397,715 | 3/1995 | Miller | 437/27 |
| 5,424,229 | 6/1995 | Oyamatsu | 437/35 |
| 5,424,234 | 6/1995 | Kwon | 437/44 |
| 5,436,482 | 7/1995 | Ogoh | 257/344 |
| 5,451,807 | 9/1995 | Fujita | 257/404 |
| 5,510,279 | 4/1996 | Chien et al. | 437/41 |
| 5,512,503 | 4/1996 | Hong | 437/43 |
| 5,518,940 | 5/1996 | Hodate et al. | 437/41 |
| 5,521,417 | 5/1996 | Wada | 257/390 |
| 5,525,552 | 6/1996 | Huang | 437/41 |
| 5,547,885 | 8/1996 | Ogoh | 437/44 |
| 5,547,888 | 8/1996 | Yamazaki | 437/52 |
| 5,578,509 | 11/1996 | Fujita | 437/35 |
| 5,585,293 | 12/1996 | Sharma et al. | 437/43 |
| 5,585,658 | 12/1996 | Mukai et al. | 257/344 |
| 5,591,650 | 1/1997 | Hsu et al. | 437/21 |
| 5,607,869 | 3/1997 | Yamazaki | 437/40 |
| 5,648,286 | 7/1997 | Gardner et al. | 437/44 |
| 5,656,518 | 8/1997 | Gardner et al. | 438/286 |
| 5,672,531 | 9/1997 | Gardner et al. | 437/44 |
| 5,677,224 | 10/1997 | Kadosh et al. | 437/57 | ical
METHOD OF MAKING TRANSISTOR WITH SELECTIVELY DOPED CHANNEL REGION FOR THRESHOLD VOLTAGE CONTROL

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

The threshold voltage ($V_T$) is the minimum gate voltage required to induce the channel. For enhancement-mode devices, the positive gate voltage of an N-channel device must be larger than some threshold voltage before a conducting channel is induced, and the negative gate voltage of a P-channel device must be more negative than some threshold voltage to induce the required positive charge (mobile holes) in the channel.

Extensive efforts are being directed towards miniaturizing IGFETs in order to increase the speed and density of the integrated circuit chips in which they are used. To increase speed, the saturation drain current ($I_{DSAT}$), also referred to as drive current, must often be increased to allow faster charging and discharging of parasitic capacitances. In short channel devices, the drive current is proportional to the difference between the gate-to-source voltage ($V_{GS}$) and the threshold voltage. Shifting the threshold voltage towards zero increases the drive current, and shifting the threshold voltage away from zero decreases the drive current.

A threshold adjust implant that adjusts the doping concentration in the channel region is often used for precisely controlling the threshold voltage. The threshold adjust implant usually occurs before forming the gate, although threshold adjust implants through the gate have also been reported. Typically, as the doping concentration in the channel region increases, the threshold voltage shifts away from zero (thereby decreasing the drive current), and likewise, as the doping concentration in the channel region decreases, the threshold voltage shifts towards zero (thereby increasing the drive current).

Unfortunately, decreasing the doping concentration in the channel region also increases the off-state source-drain leakage current. Although increasing the channel length decreases the leakage current, it also reduces packing density. In VLSI chips such as microprocessors which contain hundreds of thousands or millions of IGFETs, the leakage currents of individual IGFETs are usually limited to about 1 to 10 nanoamps in order to prevent excessive static power consumption. To keep the leakage currents within an acceptable range, yet still provide high packing density, VLSI chips usually employ submicron IGFETs with relatively high channel doping, which constrains drive currents and speed.

Accordingly, a need exists for a fabrication process which allows selected IGFETs to have channel doping that differs from that of other IGFETs so that the fastest devices, with the largest drive currents and leakage currents, can be placed in critical speed paths.

SUMMARY OF THE INVENTION

An object of the present invention is provide an IGFET with the desired threshold voltage. Generally speaking, this is accomplished by introducing a threshold adjust dopant into the channel region after forming the gate without transferring essentially any of the threshold adjust dopant through the gate. Furthermore, the threshold adjust dopant can be applied selected device regions. In this manner, the threshold voltage, as well as the drive current, leakage current and speed of selected IGFETs can be adjusted, so that the fastest IGFETs with the highest drive currents and leakage currents can be placed in critical speed paths such as a tag to an instruction cache.

In accordance with one aspect of the invention, a method of making an IGFET includes providing a semiconductor substrate with a device region that includes a source region, a drain region, and a channel region therebetween, forming a gate over the channel region, introducing a threshold adjust dopant into the channel region after forming the gate without transferring essentially any of the threshold adjust dopant through the gate, thereby adjusting a threshold voltage of the IGFET, and forming a source in the source region and a drain in the drain region.

The threshold adjust dopant can be introduced by implanting the threshold adjust dopant into the source region and then applying a high-temperature anneal to diffuse the threshold adjust dopant from the source region into the channel region. The threshold adjust dopant can be implanted and diffused before providing any doping for the source and drain, or alternatively, the threshold adjust dopant can be implanted after the source and drain are at least partially doped.

The threshold adjust dopant can be the same conductivity type as the channel region, thereby increasing the dopant concentration of the channel region and adjusting the threshold voltage in a first direction (such as away from zero), or alternatively, the threshold adjust dopant can be of opposite conductivity type to the channel region, thereby decreasing the dopant concentration of the channel region and adjusting the threshold voltage in a second direction (such as towards zero).

During fabrication of an asymmetrical transistor, the threshold adjust dopant can be implanted into the source region without being implanted into the drain region using an implant mask that covers the drain region, and a source dopant can be implanted into the source region without being implanted into the drain region using the same implant mask.

As exemplary materials, the gate is polysilicon, the gate insulator is silicon dioxide, and the threshold adjust dopant is boron.

Advantageously, the threshold voltage of selected IGFETs can be adjusted so that the fastest IGFETs (with the highest leakage current), constituting a small fraction of the IGFETs on a chip, can be placed in critical speed paths while the slower IGFETs (that exhibit less leakage current), constituting the vast majority of the IGFETs on the chip, can be placed in other circuit regions where speed is less important. This helps optimize the tradeoff between static power consumption and speed.

Another advantage is that the threshold adjust dopant can be self-aligned with the gate. An additional advantage is that during fabrication of an asymmetrical device, a single masking layer that covers the drain region can provide an implant mask for both the threshold adjust dopant and a source dopant.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
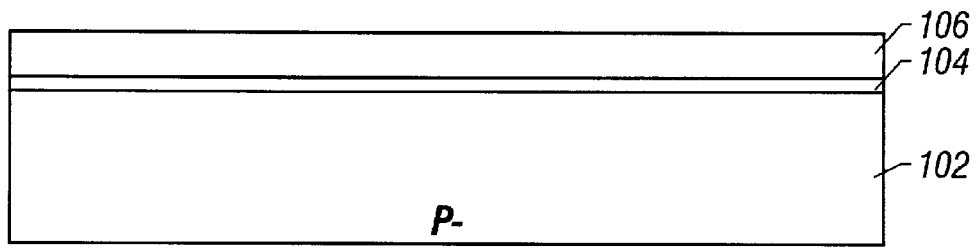
FIGS. 1A–1I show cross-sectional views of successive process steps for making a symmetrical IGFET with a selectively doped channel region in accordance with a first embodiment of the invention.

In the drawings, depicted elements are not necessarily drawn to scale and like or similar elements may be designated by the same reference numeral throughout the several views.

FIGS. 1A–1I show cross-sectional views of successive process steps for making a symmetrical IGFET with a selectively doped channel region in accordance with a first embodiment of the invention.

In FIG. 1A, a silicon substrate suitable for integrated circuit manufacture is provided. The substrate includes a P-type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. Device region 102 of the substrate is shown. If desired, device region 102 can be subjected to a well implant and/or punchthrough implant (not shown). A blanket layer of gate oxide 104, composed of silicon dioxide, is formed on the top surface of device region 102 using tube growth at a temperature of 700 to 1000° C. in an $O_2$ containing ambient. Gate oxide 104 has a thickness in the range of 30 to 60 angstroms. If desired, nitrogen can be introduced into gate oxide 104 to reduce boron penetration. Thereafter, polysilicon layer 106 is deposited by low pressure chemical vapor deposition on the top surface of gate oxide 104. Polysilicon layer 106 is undoped and has a thickness of 2000 angstroms. If desired, polysilicon layer 106 can be doped in situ as deposition occurs, or doped immediately after deposition by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that the gate be formed from a portion of polysilicon layer 106 that is initially doped during a later processing step.

Figure 1B:
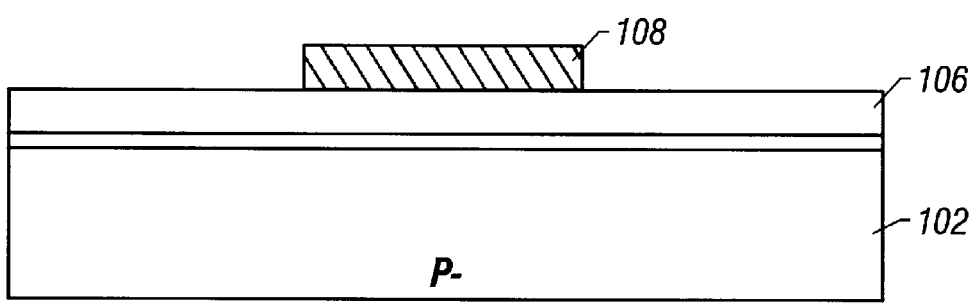

In FIG. 1B, photoresist layer 108 is deposited on polysilicon layer 106. A photolithographic system, such as a step and repeat optical projection system which generates deep ultraviolet light from a mercury-vapor lamp, uses a reticle to irradiate photoresist layer 108 with an image pattern.

Thereafter, the irradiated portions of photoresist layer 108 are removed by a developer, and photoresist layer 108 includes openings above selected portions of device region 102.

Figure 1C:
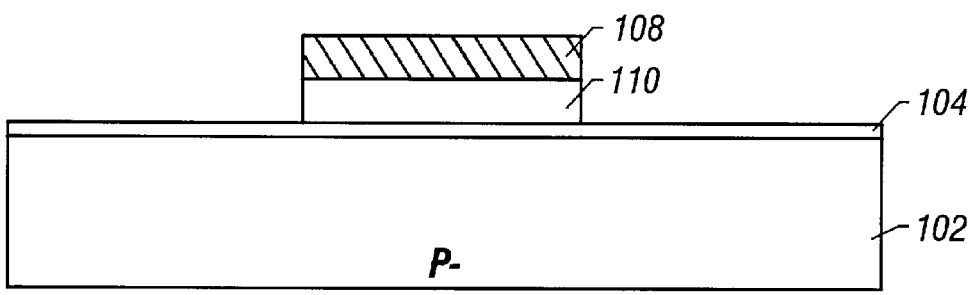

In FIG. 1C, an anisotropic dry etch is applied using photoresist layer 108 as an etch mask. Photoresist layer 108 protects the underlying portions of polysilicon layer 106, and the etch removes the exposed portions of polysilicon layer 106 beneath the openings in photoresist layer 108. The etch is highly selective of polysilicon layer 106 with respect to gate oxide 104, so only a negligible amount of gate oxide 104 is removed and the substrate is unaffected. The etch forms gate 110 from the unetched portion of polysilicon layer 106 over device region 102. Gate 110 has opposing vertical sidewalls separated by a length of 3500 angstroms, representing the minimum resolution of the photolithographic system. Gate 110 has a thickness (or height above the underlying gate oxide 104) of 2000 angstroms.

Figure 1D:
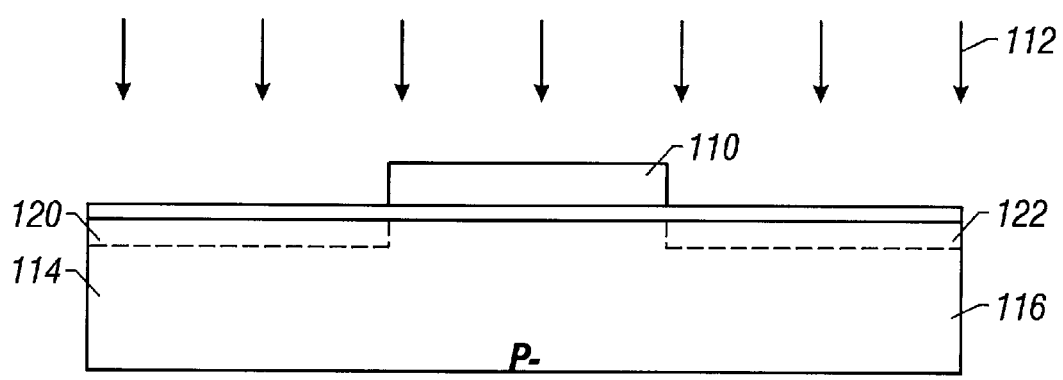

In FIG. 1D, photoresist layer 108 is stripped, and a threshold adjust dopant is provided by subjecting the structure to ion implantation of boron, indicated by arrows 112, at a dose in the range of about $4 \times 10^{12}$ to $9 \times 10^2$ atoms/cm$^2$ and a very low implant energy of about 2 to 10 kiloelectron-volts. Essentially none of the boron that impinges upon gate 110 is implanted through it. Essentially all of the boron that impinges upon source region 114 and drain region 116 is implanted at or near the top surface of the substrate. Boron regions 120 and 122, in which the boron is implanted, are depicted by the broken lines in source and drain regions 114 and 116, respectively. Boron regions 120 and 122 are self-aligned with the opposing sidewalls of gate 110 and have a boron concentration in the range of about $5 \times 10^{16}$ to $5 \times 10^{17}$ atoms/cm$^3$.

Figure 1E:
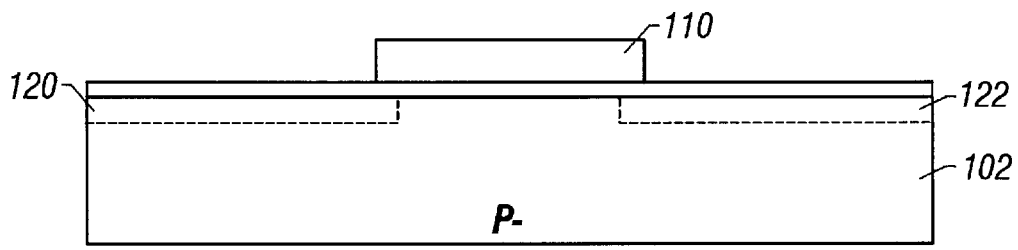

In FIG. 1E, the structure is annealed to drive-in the boron by applying a rapid thermal anneal on the order of 950 to 1050° C. for 10 to 30 seconds. Boron regions 120 and 122 diffuse both laterally and vertically. As a result, portions of boron regions 120 and 122 diffuse beneath gate 110. However, little or no boron diffuses from gate 110 into device region 102. That is, essentially all the boron which diffuses beneath gate 110 is boron which was implanted into device region 102 outside gate 110.

Figure 1F:
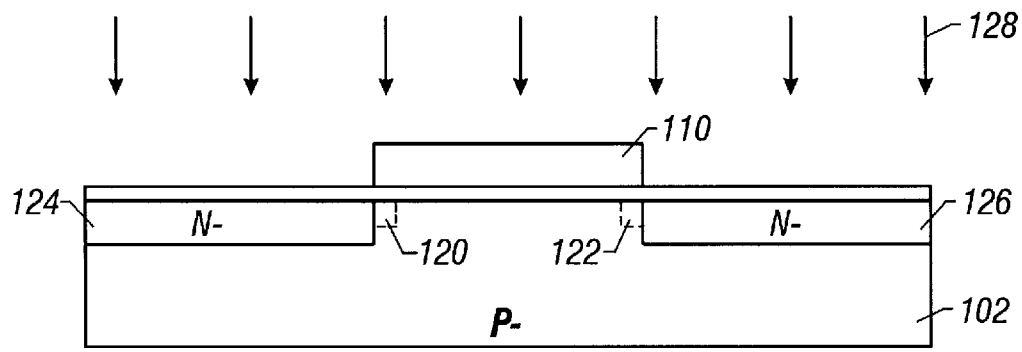

In FIG. 1F, lightly doped source and drain regions 124 and 126 are implanted into device region 102 by subjecting the structure to ion implantation of a combination of arsenic and phosphorus, indicated by arrows 128, at a dose in the range of $1 \times 10^{13}$ to $5 \times 10^{14}$ atoms/cm$^2$ and an energy of 30 to 45 kiloelectron-volts, using gate 110 as an implant mask. As a result, lightly doped source and drain regions 124 and 126 are implanted into device region 102 and are self-aligned with the opposing sidewalls of gate 110. Moreover, lightly doped source and drain regions 124 and 126 counterdope and effectively eliminate the portions of boron regions 120 and 122 outside gate 110. Lightly doped source and drain regions 124 and 126 are doped N− with a dopant concentration in the range of about $1 \times 10^{17}$ to $1 \times 10^{18}$ atoms/cm$^3$.

Figure 1G:
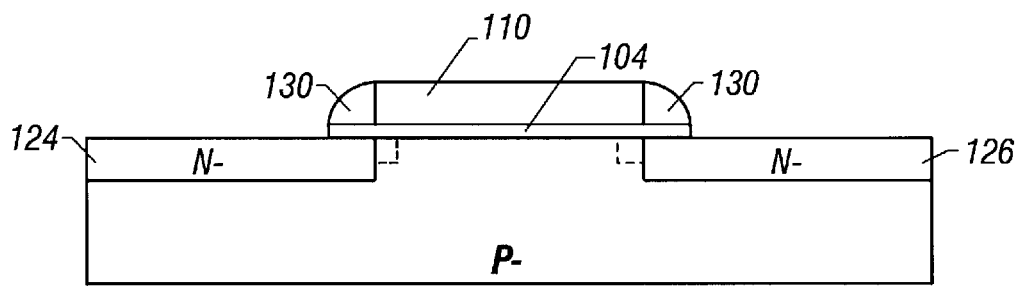

In FIG. 1G, an oxide layer with a thickness of 1500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 130 adjacent to the sidewalls of gate 110, and removes portions of gate oxide 104 outside gate 110 and spacers 130. Spacers 130 cover portions of lightly doped source and drain regions 124 and 126 in close proximity to gate 110.

Figure 1H:
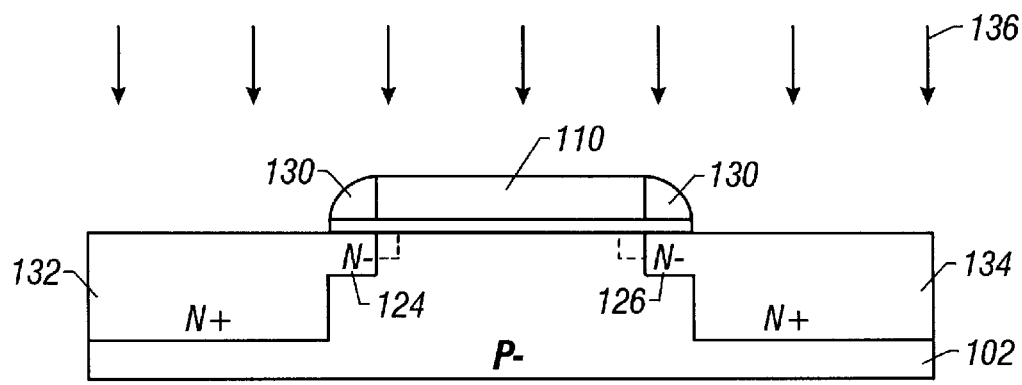

In FIG. 1H, heavily doped source and drain regions 132 and 134 are implanted into device region 102 by subjecting the structure to ion implantation of arsenic, indicated by arrows 136, at a dose in the range of $1 \times 10^{15}$ to $5 \times 10^{15}$ atoms/cm$^2$ and an energy of about 40 to 60 kiloelectron-volts, using gate 110 and spacers 130 as an implant mask. As a result, heavily doped source and drain regions 132 and 134 are implanted into device region 102 and are self-aligned to the outside edges of spacers 130. Moreover, heavily doped source and drain regions 132 and 134 effectively eliminate the portions of lightly doped source and drain regions 124 and 126, respectively, outside spacers 130. Heavily doped source and drain regions 132 and 134 are doped N+ with a dopant concentration in the range of about $1 \times 10^{18}$ to $1 \times 10^2$ atoms/cm$^3$.

Figure 1I:
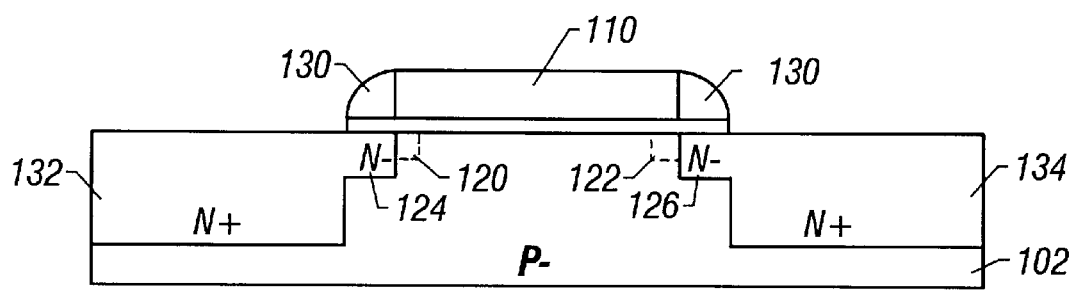

In FIG. 1I the structure is annealed to remove crystalline damage and to drive-in and activate the implanted source/drain dopants by applying a rapid thermal anneal on the order of 950 to 1050° C. for 10 to 30 seconds. Boron regions 120 and 122 and lightly and heavily doped source and drain regions 124, 126, 132 and 134 diffuse both laterally and vertically. As is seen, lightly doped source and drain regions 124 and 126 diffuse slightly beneath gate 110, and heavily doped source and drain regions 132 and 134 diffuse slightly beneath spacers 130. Furthermore, boron regions 120 and 122 diffuse even further beneath gate 110, and essentially no boron diffuses from gate 110 into device region 102. The anneal forms a source, consisting of lightly and heavily doped source regions 124 and 132 in the source region of device region 102, and forms a drain, consisting of lightly and heavily doped drain regions 16 and 134 in the drain region of device region 102, for a symmetrical enhancement-mode N-channel IGFET controlled by gate 110.

Boron regions 120 and 122 provide threshold adjust doping in the channel region of the IGFET. That is, boron a regions 120 and 122 increase the net doping concentration in the channel region, at or near the top surface of the channel region, thereby shifting the threshold voltage of the IGFET away from zero by about 100 to 300 millivolts. Furthermore, boron regions 120 and 122 are sufficiently shallow that they provide no appreciable affect on the punchthrough voltage of the IGFET.

The channel region in device region 102 has a non-uniform lateral doping profile. That is, the channel doping changes as a function of lateral distance along the channel region between the source-side channel junction and the drain-side channel junction. In particular, the channel doping in boron region 120 gradually decreases as the distance from the source-side channel junction increases, and the channel doping in boron region 122 gradually decreases as the distance from the drain-side channel junction increases. Furthermore, the channel doping between boron regions 120 and 122 is relatively constant.

FIGS. 2A–2J show cross-sectional views of successive process steps for making an asymmetrical IGFET with a selectively doped channel region in accordance with a second embodiment of the invention. In the first embodiment, the IGFET is a symmetrical device in which the source is essentially identical to the drain. In the second embodiment, an asymmetrical device is fabricated in which a heavily doped source region provides the source-side channel junction and a lightly doped drain region provides tile drain-side channel junction.

As IGFET dimensions are reduced and the supply voltage remains constant (e.g., 3V), the electric field in the channel near the drain tends to increase. If the electric field becomes strong enough, it gives rise to hot carrier effects. For instance, electrons overcome the potential energy barrier between the substrate and the gate insulator thereby causing hot carriers to become injected into the gate insulator. This tripped charge in the gate insulator accumulates over time and can permanently change the threshold voltage of the device.

A popular technique for reducing hot carrier effects is to use a lightly doped drain region (or LDD) at the drain-side channel junction. The lightly doped drain region reduces hot carrier effects by reducing the maximum lateral electric field. Symmetrical transistors with lightly doped drain regions also include lightly doped source regions. A disadvantage of lightly doped source and drain regions is the increased parasitic resistance due to their light doping levels. Linear drain current (in the linear or triode region) is reduced by the parasitic resistance in both the source and drain. Saturation drain current (in the saturation region) is largely unaffected by the parasitic resistance of the drain but is greatly reduced by the parasitic resistance of the source. Therefore, providing a lightly doped region only on the drain side allows high saturation drain current while reducing hot carrier effects. In this fashion, the drain includes lightly and heavily doped regions, and the entire source is heavily doped. IGFETS in critical speed paths are particularly good candidates for asymmetrical doping. During manufacture, asymmetrical source/drain doping can be accomplished by using an implant mask layer that covers the drain region without covering the source region, then implanting a dopant into the source side without implanting the dopant into the drain side.

The second embodiment of the present invention discloses an approach for making an asymmetrical device with selective threshold doping. Unless otherwise noted, the elements for the second embodiment (e.g., gate oxide 204, gate 210, etc.) are similar to elements of the first embodiment (e.g., gate oxide 104, gate 110, etc.), and the description of related elements and process steps need not be repeated.

Figure 2A:
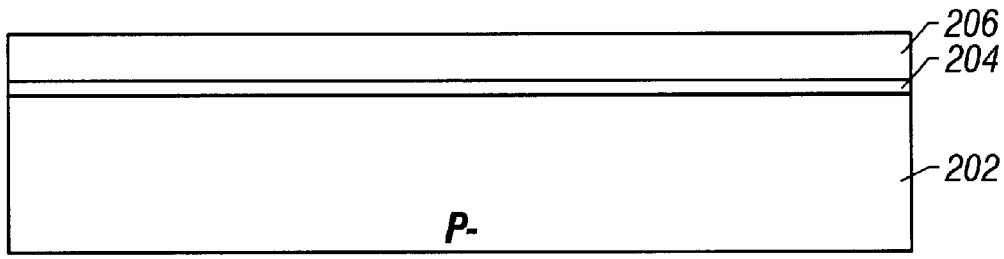
FIGS. 2A–2J show cross-sectional views of successive process steps for making an asymmetrical IGFET with a selectively doped channel region in accordance with a second embodiment of the invention.

In FIG. 2A, a silicon substrate suitable for integrated circuit manufacture is provided. The substrate includes a P– type epitaxial surface layer with a planar top surface disposed on a P+ base layer (not shown). Device region 202 of the substrate is shown. If desired, device region 202 can be subjected to a well implant and/or punchthrough implant (not shown). Gate oxide 204, composed of silicon dioxide, is thermally grown on the top surface of device region 202. Thereafter, polysilicon layer 206 is deposited by low pressure chemical vapor deposition on gate oxide 204.

Figure 2B:
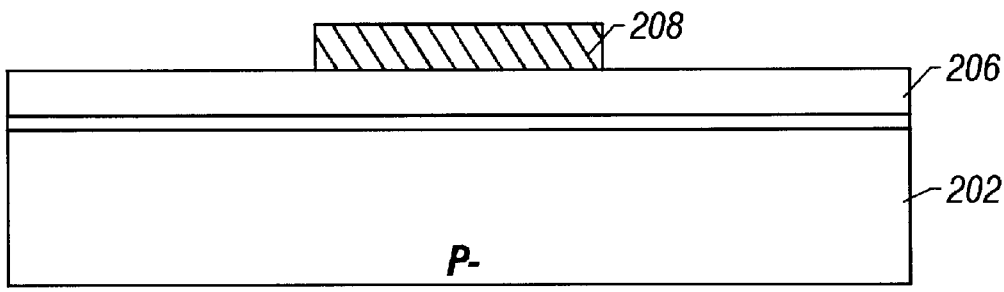

In FIG. 2B, photoresist layer 208 is deposited on polysilicon layer 206, selectively irradiated, and the irradiated portions are removed so that photoresist layer 208 includes openings above selected portions of device region 202.

Figure 2C:
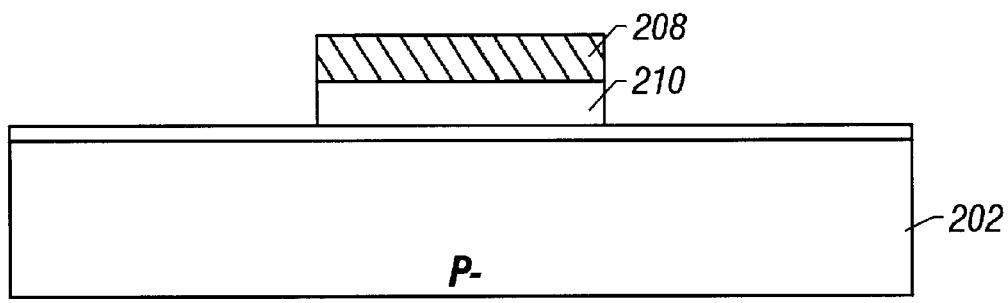

In FIG. 2C, an anisotropic dry etch is applied using photoresist layer 208 as an etch mask. The etch removes portions of polysilicon layer 206 beneath the openings in photoresist layer 208 and forms gate 210 from the unetched portion of polysilicon layer 206 over device region 202.

Figure 2D:
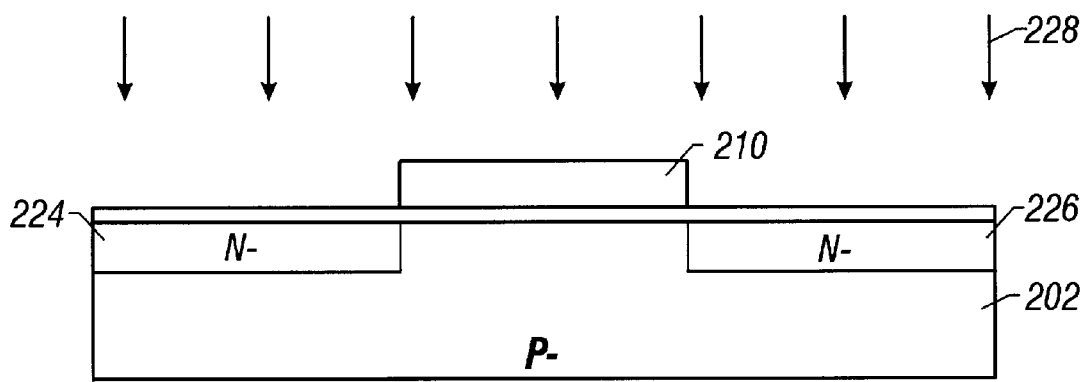

In FIG. 2D, photoresist layer 208 is stripped, and lightly doped source and drain regions 224 and 226 are implanted into device region 202 by subjecting the structure to ion implantation of arsenic (without phosphorus), indicated by arrows 228, using gate 210 as an implant mask. As a result, lightly doped source and drain regions 224 and 226 are implanted into device region 202, are doped N−, and are self-aligned with the opposing sidewalls of gate 210.

Figure 2E:
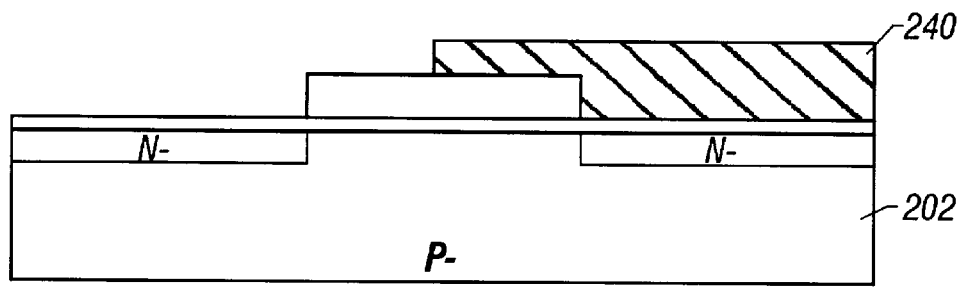

In FIG. 2E, photoresist layer 240 is deposited over the structure, selectively irradiated, and the irradiated portions are removed so that photoresist layer 240 includes an opening above the entire source region of device region 202 while photoresist layer 240 covers the entire drain region of device region 202.

Figure 2F:
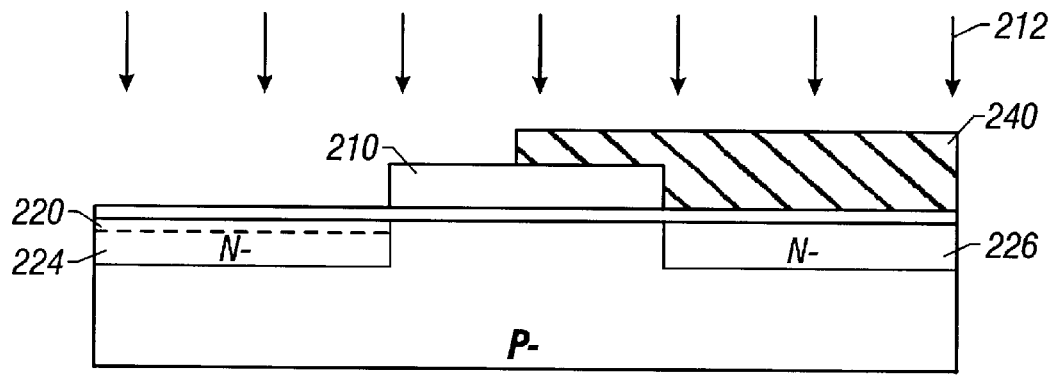

In FIG. 2F, a threshold adjust dopant is provided by subjecting the structure to ion implantation of boron, indicated by arrows 212. Essentially none of the boron that impinges upon gate 210 or photoresist layer 240 is implanted therethrough. Essentially all of the boron that impinges upon source region 214 is implanted at or near the top surface of the substrate. Boron region 220, in which the boron is implanted, is depicted by the dots. Boron region 220 does not have a sufficiently high concentration to counter-dope (render P-type) the portion of lightly doped drain region 224 in which it resides. Furthermore, essentially no boron reaches lightly doped source region 226.

Figure 2G:
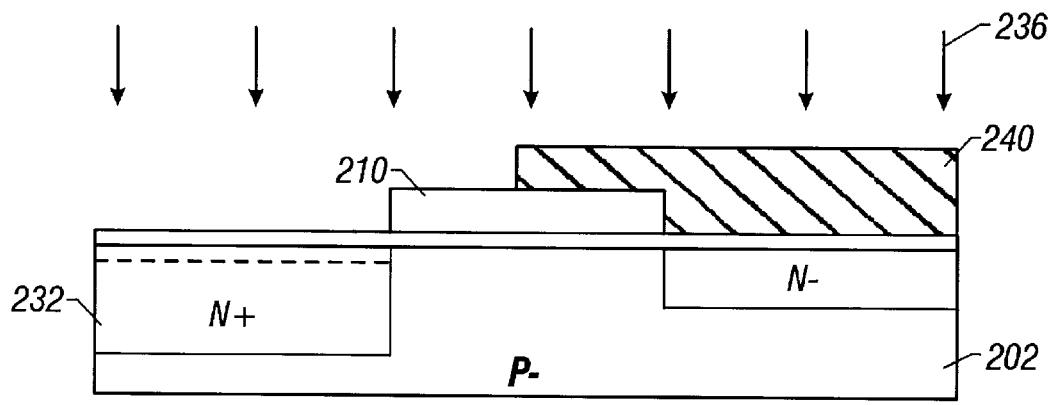

In FIG. 2G, heavily doped source region 232 is implanted into device region 202 by subjecting the structure to ion implantation of arsenic, indicated by arrows 236, using gate 210 and photoresist 240 as an implant mask. As a result, heavily doped source region 232 is self-aligned with gate 210 and effectively eliminates lightly doped source region 224.

Figure 2H:
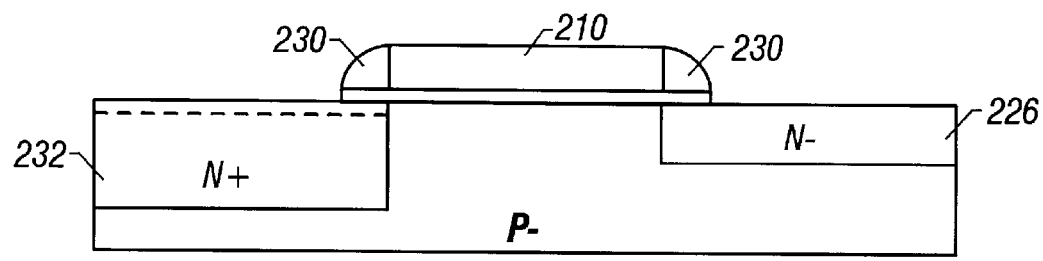

In FIG. 2H, photoresist layer 240 is stripped, an oxide layer is conformally deposited over the exposed surfaces, and the structure is subjected to an anisotropic reactive ion etch that forms oxide spacers 230 adjacent to the sidewalls of gate 210. Spacers 230 cover portions of heavily doped source region 232 and lightly doped drain region 226 in close proximity to gate 210.

Figure 2I:
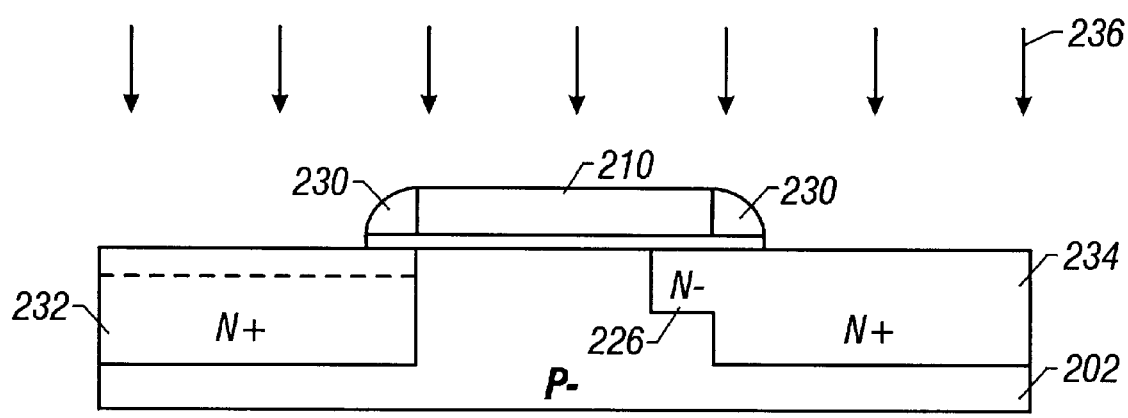

In FIG. 2I, heavily doped drain region 234 is implanted into device region 202 by subjecting the structure to ion implantation of arsenic, indicated by arrows 236, using gate 210 and spacers 230 as an implant mask. As a result heavily doped drain region 234 is implanted into device region 202 and is self-aligned to the outside edge of drain-side spacer 230. Moreover, heavily doped drain region 234 effectively eliminates the portion of lightly doped drain region 226 outside drain-side spacer 230. Heavily doped drain region 234 is doped N+. During this implant step, the doping concentration of heavily doped source region 232 outside source-side spacer 130 also increases, which can be considered an ultra-heavily doped source region.

Figure 2J:
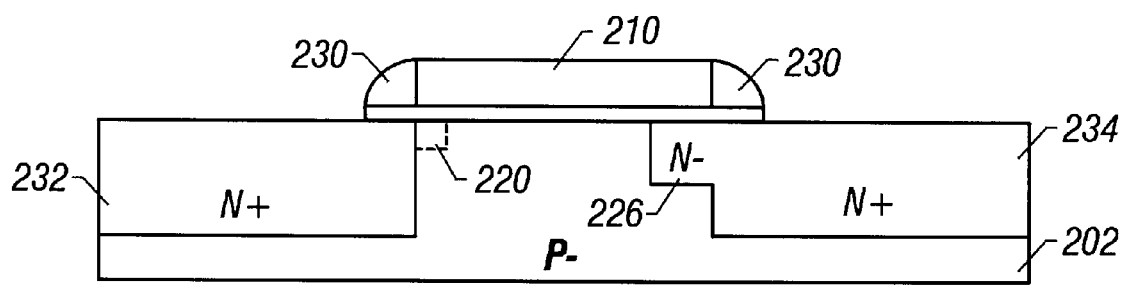

In FIG. 2J, the structure is annealed to remove crystalline damage and to drive-in and activate the implanted dopants by applying a rapid thermal anneal on the order of 950 to 1050° C. for 20 to 60 seconds. Boron region 220, heavily doped source region 232 and lightly and heavily doped drain regions 226 and 234 diffuse both laterally and vertically. As is seen, heavily doped source region 232 and lightly doped drain region 226 diffuse slightly beneath gate 210, and heavily doped drain region 234 diffuses slightly beneath drain-side spacer 230. Furthermore, since boron diffuses far more rapidly than arsenic, boron region 220 laterally diffuses out of heavily doped source region 232 and into the channel region at or near the top surface of the substrate. In this manner, boron region 220 provides a threshold adjust dopant for the IGFET. In addition essentially no boron diffuses from gate 210 into device region 202. For convenience of explanation, the portion of boron region 220 that diffuses out of the source region and into the channel region is shown by the broken lines, and the portion of boron region 220 remaining in the source region is not shown. The anneal forms a source, consisting of heavily doped source region 232 in the source region of device region 202, and a drain, consisting of lightly and heavily doped drain regions 226 and 234 in the drain region of device region 202, for an asymmetrical enhancement-mode N-channel IGFET controlled by gate 210.

The channel region in device region 202 has a non-uniform lateral doping profile. That is, the channel doping changes as a function of lateral distance along the channel region between the source-side channel junction and the drain-side channel junction. In particular, the channel doping in boron region 220 gradually decreases as the distance from the source-side channel junction increases. Thus, the channel doping has its highest concentration adjacent to the source-side channel junction, and its lowest concentration adjacent to the drain-side channel junction.

Providing the threshold adjust dopant adjacent to both the source-side channel junction and the drain-side channel junction (the first embodiment) compared to providing the threshold adjust dopant adjacent to only the source-side channel junction (the second embodiment) adjusts the threshold voltage by a larger amount since more of the threshold adjust dopant is introduced into the channel region. In addition, diffusing the threshold adjust dopant during a high-temperature anneal before providing any source/drain doping (the first embodiment) compared to diffusing the threshold adjust dopant after providing source/drain doping (the second embodiment) adjusts the threshold voltage by a larger amount since more of the threshold adjust dopant is introduced into the channel region. However, providing the threshold adjust dopant adjacent to only the source-side channel junction compared to providing the threshold adjust dopant adjacent to both the source-side and drain-side channel junctions reduces hot carrier effects and improves threshold voltage roll-off characteristics.

Further processing steps in the fabrication of IGFETs typically include forming salicide contacts on the gates, sources and drains, forming a thick oxide layer over the device regions, forming contact windows in the oxide layer to expose the salicide contacts, forming interconnect metallization in the contact windows, building up various layers of metallization (such as Metal 1 through Metal 5), and forming a passive don layer over the metallization. In addition, earlier or subsequent high-temperature process steps can be used to supplement or replace the anneal steps to provide the desired anneal, activation, and drive-in functions. These further processing steps are conventional. Likewise the principal processing steps disclosed herein may be combined with other steps apparent to those sidled in the art.

The present invention includes numerous variations to the embodiments described above. For instance, the gate can include various conductors such as polysilicon, epitaxial silicon, conductive metals, and conductive metal silicides. The gate insulator and spacers can be various dielectrics such as silicon dioxide, silicon nitride and silicon oxynitride. The device region can be isolated from other device regions in the substrate using various techniques such as LOCOS oxidation. Various masking layers, patterned by overlying photoresist layers, can be used as an etch mask and/or implant mask. Suitable N-type dopants include arsenic and phosphorus; suitable P-type dopants include boron $B_{10}$, boron $B_{11}$, and $BF_X$ species such as $BF_2$.

The threshold adjust dopant can be the same conductivity type as the channel region, thereby increasing the dopant concentration of the channel region and adjusting the threshold voltage in a first direction (such as away from zero), or the threshold adjust dopant can be of opposite conductivity type to the channel region, thereby decreasing the dopant concentration of the channel region (without changing the conductivity type of the channel region) and adjusting the threshold voltage in a second direction (such as towards zero). The former is preferred, since counterdoping the channel region lowers the mobility of carriers in the channel region.

The substrate may include first device regions (constituting the vast majority of device regions) in non-critical speed paths where a high threshold voltage is acceptable and a low off-state leakage current is essential, and second device regions (constituting a small fraction of the device regions) in critical speed paths where a low threshold voltage is essential and high off-state leakage current is acceptable. For instance, the high threshold voltage is 100 to 300 millivolts larger than the low threshold voltage, and the high leakage current is 10 to 100 times larger than the low leakage current.

This can be accomplished by providing a first threshold adjust dopant only in the first device regions and a second threshold adjust dopant only in the second device regions. This approach includes providing a masking layer that covers the second device regions and includes openings above the first device regions, and implanting a first threshold adjust dopant into the first device regions but not the second device regions, thereby providing the first device regions with a first threshold voltage without providing the second device regions with the first threshold voltage. Thereafter, gate insulators and gates are formed over the first and second device regions, and then the threshold voltages of the second device regions, but not the first device regions, are adjusted as described in the first or second embodiments above. That is, a masking layer covers the first device regions and includes openings above the second device regions, and a second threshold adjust dopant (such as the boron indicated by arrows 112 or 212) is implanted into the second device regions but not the first device regions.

This can also be accomplished by providing a first threshold adjust dopant in the first and second device regions and then providing a second counterdoping threshold adjust dopant only in the second device regions. This approach includes implanting a first threshold adjust dopant into the first and second device regions, then forming gate insulators and gates over the first and second device regions, and then adjusting the threshold voltages of the second device regions, but not the first device regions, in a manner similar to that described in the first and second embodiments, except that the threshold adjust dopant counterdopes the channel regions.

In either case, the IGFETs in the first device regions have higher threshold voltages, as well as lower drive currents and lower off-state leakage currents, than the IGFETs in the second device regions.

As another variation, the threshold adjust dopant can be diffused for a sufficiently long time that it provides a substantially uniform lateral doping profile in the channel region. However, a non-uniform lateral doping profile is generally preferred. For instance, when the threshold adjust dopant is diffused into the channel region to provide a non-uniform lateral doping profile before any source/drain doping occurs, the anneal parameters (time and temperature) can be selected to precisely control the amount of diffusion, and therefore the threshold voltage, without affecting the source/drain characteristics.

In still other variations, aspects of the first and second embodiments can be combined with one another. For instance, the threshold adjust dopant can be implanted into the source region, but not the drain region, of a transistor with symmetrical source/drain doping, to reduce hot carrier effects and improve threshold voltage roll off characteristics. Likewise, the threshold adjust dopant can be implanted into the source region and/or drain region of an asymmetrical transistor and then diffused into the channel region before any source/drain doping occurs.

It should be noted that if a threshold adjust dopant of phosphorus or arsenic is implanted and self-aligned with the gate, and a source/drain dopant of boron or boron species is implanted and self-aligned with the gate, then it is necessary to implant the threshold adjust dopant and then diffuse the threshold adjust dopant into the channel region before implanting the source/drain dopant since boron diffuses more rapidly than phosphorus and far more rapidly than arsenic.

The invention is particularly well-suited for fabricating N-channel MOSFETs, P-channel MOSFETs and other types of IGFETs, particularly for high-performance microprocessors where high circuit density is essential. Although a single device has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET, comprising the steps of:
   providing a semiconductor substrate with a device region that includes a source region, a drain region and a channel region therebetween;
   forming a gate over the channel region;
   introducing a threshold adjust dopant into the channel region after forming the gate without transferring essentially any of the threshold adjust dopant through the gate, thereby adjusting a threshold voltage of the IGFET; and
   forming a source in the source region and a drain in the drain region.

2. The method of claim 1, wherein the threshold adjust dopant provides the channel region with a non-uniform lateral doping profile.

3. The method of claim 1, wherein introducing the threshold adjust dopant includes implanting the threshold adjust dopant into the source region and applying a high-temperature anneal to diffuse the threshold adjust implant from the source region into the channel region before providing any doping for the source and the drain.

4. The method of claim 1, wherein introducing the threshold adjust dopant includes implanting the threshold adjust dopant into the source region after at least partially doping the source.

5. The method of claim 1, wherein introducing the threshold adjust dopant includes implanting the threshold adjust dopant into the source and drain regions using the gate as an implant mask for the channel region.

6. The method of claim 1, wherein introducing the threshold adjust dopant includes implanting the threshold adjust dopant into the source region without implanting the threshold adjust dopant into the drain region.

7. The method of claim 1, wherein the threshold adjust dopant changes the threshold voltage by about 100 to 300 millivolts.

8. The method of claim 1, wherein the threshold adjust dopant has no appreciable affect on a punchthrough voltage of the IGFET.

9. The method of claim 1, wherein the threshold adjust dopant and the channel region are identical conductivity types, and the threshold adjust dopant increases a doping concentration in the channel region thereby adjusting the threshold voltage.

10. The method of claim 1, wherein the threshold adjust dopant is introduced into first device regions in the semiconductor substrate without being introduced into second device regions of the semiconductor substrate, thereby adjusting a threshold voltage of selected IGFETs in the first device regions without adjusting a threshold voltage of other IGFETs in the second device regions.

11. A method of making an asymmetrical IGFET, comprising the steps of:

providing a semiconductor substrate with a device region that includes a source region, a drain region and a channel region therebetween;

forming a gate insulator on the channel region;

forming a gate on the gate insulator;

forming a masking layer that covers the drain region without covering the source region;

implanting a threshold adjust dopant into the source region without implanting essentially any of the threshold adjust dopant into the drain region;

implanting a source dopant into the source region without implanting essentially any of the source dopant into the drain region;

providing a high-temperature anneal to diffuse the threshold adjust dopant from the source region into the channel region, such that essentially all of the threshold adjust dopant in the channel region is diffused from the source region into the channel region, thereby adjusting a threshold voltage of the IGFET; and forming a source in the source region and a drain in the drain region.

12. The method of claim 11, wherein the threshold adjust dopant provides the channel region with a non-uniform lateral doping profile that has a greater doping concentration adjacent to the source region than adjacent to the drain region.

13. The method of claim 11, wherein the high-temperature anneal is applied before providing any doping for the source and the drain.

14. The method of claim 11, wherein the source includes a heavily doped source region that provides a first channel junction, the drain includes a lightly doped drain region that provides a second channel junction, and the drain includes a heavily doped drain region spaced from the second channel junction.

15. The method of claim 11, wherein the gate is polysilicon, the gate insulator is selected from the group consisting of silicon dioxide, silicon nitride and silicon oxynitride, and the masking layer is photoresist.

16. A method of making an IGFET, comprising the following steps in the sequence set forth:

providing a semiconductor substrate with a device region of first conductivity type that includes a source region, a drain region and a channel region therebetween;

forming a gate insulator on the channel region;

forming a gate on the gate insulator;

implanting a threshold adjust dopant of the first conductivity type into the source region;

applying a first high-temperature anneal to diffuse the threshold adjust dopant from the source region into the channel region, such that essentially all of the threshold adjust dopant in the channel region is diffused from another region of the device region into the channel region, thereby providing a non-uniform lateral doping profile in the channel region and adjusting a threshold voltage of the IGFET;

implanting one or more source/drain dopants of a second conductivity type, opposite the first conductivity type, into the source and drain regions, thereby providing essentially all doping of the second conductivity type in the source and drain regions; and applying a second high-temperature anneal to activate the source/drain dopants, thereby forming a source in the source region and a drain in the drain region.

17. The method of claim 16, including implanting the threshold adjust dopant into the source region without implanting essentially any of the threshold adjust dopant into the drain region and the channel region, and transferring essentially all of the threshold adjust dopant into the channel region by diffusing the threshold adjust dopant from the source region into the channel region.

18. The method of claim 16, including implanting the threshold adjust implant into first device regions in the semiconductor substrate without implanting essentially any of the threshold adjust implant into second device regions in the semiconductor substrate, wherein the first device regions are in a critical speed path and the second device regions are not in a critical speed path.

19. The method of claim 16, used in fabricating an integrated circuit chip.

20. The method of claim 16, used in fabricating an electronic system that includes a microprocessor, a memory and a system bus.

* * * * *